United States Patent [19]

Chiu et al.

[11] 4,229,247

[45] Oct. 21, 1980

[54] GLOW DISCHARGE ETCHING PROCESS FOR CHROMIUM

[75] Inventors: George T. Chiu, Wappingers Falls; James R. Kitcher, Poughkeepsie; Gunars M. Ozols, Wappingers Falls; Bryant N. Zingerman, Monroe, all of N.Y.

[73] Assignee: International Business Machines Corporation, Armonk, N.Y.

[21] Appl. No.: 972,844

[22] Filed: Dec. 26, 1978

[51] Int. Cl.³ .............................................. C23F 1/02
[52] U.S. Cl. .................................. 156/643; 156/646; 156/652; 156/656; 156/659.1; 204/192 E; 252/79.1
[58] Field of Search ............... 156/643, 646, 656, 664, 156/652, 659; 204/164, 192 E, 192 EC, 298; 250/531; 252/79.1

[56] References Cited

U.S. PATENT DOCUMENTS

| | | | |
|---|---|---|---|
| 3,615,956 | 10/1971 | Irving et al. | 156/646 X |
| 3,951,709 | 4/1976 | Jacob | 156/643 |
| 3,975,252 | 8/1976 | Fraser et al. | 204/192 |
| 3,994,793 | 11/1976 | Harvilchuck | 204/192 |

FOREIGN PATENT DOCUMENTS 51-50244  5/1976  Japan ........................... 156/646

OTHER PUBLICATIONS

Kodak Microelectronics Seminar 1976, A Study of the Optical Emission from a R7 Plasma During Semiconductor Etching, by W. R. Harshbarger et al, pp. 1-14.
IBM Technical Disclosure Bulletin, vol. 19, No. 3, Aug. 1976, Etching Fine Patterns in Chromium and Refractory Metals by H. C. Kluge et al, p. 900.
IBM Technical Disclosure Bulletin, vol. 20, No. 2, Jul. 1977, Increasing the Selectivity of the Plasma Etch Rate of $SiO_2$ Relative to Si, p. 757.

Primary Examiner—William A. Powell
Attorney, Agent, or Firm—David M. Bunnell

[57] ABSTRACT

Chromium is etched in a glow discharge without attack on Al/Cu, Si, $SiO_2$, and $Si_3N_4$ layers by etching in a low pressure ambient atmosphere containing a polychlorinated organic compound such as $CCl_4$, water, and a material selected from the group consisting of the noble gases and oxygen.

16 Claims, 3 Drawing Figures

GLOW DISCHARGE ETCHING PROCESS FOR CHROMIUM

BACKGROUND OF THE INVENTION

This invention relates generally to a glow discharge etching process and more specifically to the etching of chromium by a glow discharge in an ambient atmosphere containing chlorine, oxygen or a noble gas, and water.

The etching of materials in a gas plasma formed from reactive gases is known. These processes can generally be divided into two types, termed "plasma etching" and "reactive ion etching". In plasma etching, the workpiece is placed in a chamber and a glow discharge is maintained by supplying RF energy to an electrode or electrodes which are external to the chamber. Typical power levels are 100 to 400 watts at 13.5 MHz and pressures are 0.05 to a few Torr. An example of this apparatus and process is shown in U.S. Pat. No. 3,951,709. In reactive ion etching, the workpiece is placed on an electrode in a chamber and a glow discharge is maintained by supplying RF energy to the electrode. Typical power levels are 0.1 to 0.5 watts/cm$^2$ at 13.5 MHz and pressures are 5 to 50 milli-torr. The reactive ion etching process provides directional etching. An example of this process and apparatus is shown, for example, in U.S. Pat. No. 3,994,793. U.S. Pat. No. 3,951,709 discloses a process for forming semiconductor photomasks by etching metal layers, such as chromium or gold, on glass by a plasma etching process using gas mixtures of chlorine compounds such as $CCl_4$ and $C_2HCl_3$ mixed with oxygen. U.S. Pat. No. 3,994,793 discloses a process for selectively etching aluminum and aluminum alloys by a reactive ion etching process using a halogen containing gas mixture such as $CCl_4$ and argon.

In forming conductive metallurgy patterns for integrated circuits of, for example, aluminum, problems of poor adhesion of the metallurgy to dielectric layers and of contamination of the semiconductor by alloying with the conductor metallurgy can occur. Therefore, auxiliary barrier layers of metals such as chromium, titanium, tungsten, and tantalum are used. These metal layers must be etched without significant attack on either the aluminum metallurgy, the silicon dioxide and nitride dielectric layers or the silicon substrate. Chlorine containing gases are known to rapidly attack silicon, for example, see U.S. Pat. No. 3,615,956, column 5, line 24-26.

Copending application Ser. No. 866,087, filed Dec. 30, 1977, now abandoned, entitled "Reactive Ion Etching Process for Metals" discloses a process employing gas mixtures of 5 to 20% by volumne of organic chlorine compounds, such as $CCl_4$ or $C_2HCl_3$ and 80-95% by volume of oxygen, which mixtures do not significantly etch aluminum or silicon while reactively ion etching the barrier metal layers.

In the process of application Ser. No. 866,087 $SiO_2$ still measurably etches and, $CCl_4$ contents of above about 10%, $Si_3N_4$ etches. We have now found a process whereby chromium can be etched while $SiO_2$ and $Si_3N_4$ as well as silicon are not measurably attacked. Also, at higher $CCl_4$ contents the etch rates of silicon containing materials are decreased substantially.

Harshbarger et al. "A Study of the Optical Emission from a RF Plasma During Semiconductor Etching", Kodak Microelectronics Seminar 1976, have reported that the addition of water to a plasma of $CF_4$ and $O_2$ impedes the etching of silicon and causes the formation of a residue. The effects of water being present are termed deleterious.

BRIEF SUMMARY OF THE INVENTION

In accordance with this invention there is provided a process for selectively etching chromium by exposing the chromium to a glow discharge in a low pressure ambient atmosphere of a polychlorinated organic compound, water, and a material selected from the group consisting of a noble gas and oxygen.

DETAILED DESCRIPTION

Figure 1A:
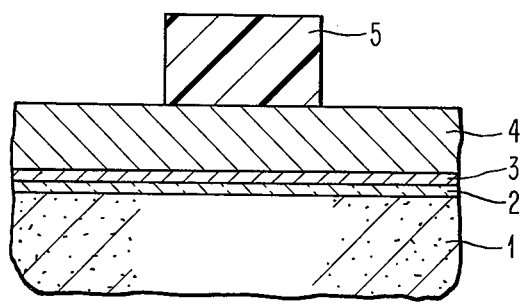
FIGS. 1A to 1C are cross-sectional views of a device structure illustrating an application of the process of the invention.

The etch process of the invention is carried out in a reactive ion etch system. The reactive ion etch system provides directional etching which results in straighter etched sidewalls so that better replication of the overlying resist pattern is obtained when compared to, for example, wet etching or plasma etching. The latter processes are non-directional in that the sidewalls under the resist mask are subject to etching. Suitable reactive ion etch tools are known in the art and a reactive ion etch system is schematically shown, for example, in FIG. 1 of U.S. Pat. No. 3,994,793 whose teachings are hereby incorporated by reference. In the reactive ion etching system and process, the substrate to be etched is placed on a plate on a cathode which is connected to an RF power source so that it is electrically biased relative to a second electrode, or anode, which is parallel to and spaced from the cathode. The plate can be of various materials such as, for example, quartz, silicon, and aluminum. The reactive ion etch process is carried out at low pressures of from about 5 to 50 milli-torr with pressures of 10 to 30 milli-torr being preferred in the process of the invention. Power densitites range from about 0.1 to 0.5 watts/cm$^2$, with a preferred power density being about 0.25 watts/cm$^2$ where organic resist masking layers are used, in order to avoid excessive loss of resist thickness. Auxiliary heating of the cathode plate to raise the temperature of the substrate can be employed in order to increase the etch rates. Because the photoresist tends to degrade at higher temperatures, a trade-off between etch rate and loss of resist thickness must be made.

The gas compositions suitable for the practice of the process of the invention are volatile polychlorinated organic materials having 1 to 2 carbon atoms, for example, $CCl_4$ and $C_2HCl_3$ which are mixed with oxygen or a noble gas and water.

The preferred compositions of polychlorinated compound and oxygen are those which contain from about 5 to no more than about 20% by volume of polychlorinated compound because, as described in application Ser. No. 866,087, the etch rate of silicon and aluminum-copper at this level is insignificant. Silicon dioxide and silicon nitride, however, are still etched by this mixture. The addition of about 5 to 30% by volume with a preferred range of about 10 to 20% by volume of water vapor to the etching gas mixture of oxygen or noble gas and polychlorinated compound prevents significant etching of silicon dioxide and silicon nitride and does not decrease the etch rate of chromium. The addition of water vapor to 50/50 mixtures by volume of polychlorinated compound and oxygen will reduce, but not prevent the etching of silicon, silicon dioxide and silicon nitride but does avoid the etching of aluminum-copper alloy. Because the etch rate of chromium remains about the same with the 50/50 mixture as with, for example, a 20/80 mixture, there is no particular advantage in using larger amounts of the polychlorinated compound relative to oxygen. The same general effects are noted when a noble gas, for example, helium, argon, neon and zenon is substituted for oxygen as illustrated in Table II below except that the higher noble gas concentrations (50/50 by volume) the etch rate of silicon does not appear to be significantly effected by the addition of the water vapor.

The invention is further illustrated by, but is not intended to be limited to the following examples.

EXAMPLE I

The effect of water vapor on the etch rates of silicon, silicon dioxide, silicon nitride, aluminum-copper alloy, and chromium is illustrated by etching blanket layers of the metals and silicon compounds coated onto silicon wafers or by etching the surface of a single crystal silicon wafer in a reactive ion etch chamber with the samples located at the cathode. The power density is 0.26 watts/cm$^2$, the pressures employed are 10 to 12 milli-torr and the gas composition ranges are from 2 to 5 parts by volume CCl$_4$ (partial pressure 2–5 milli-torr), 5 to 8 parts by volume (partial pressure 5–8 milli-torr) of argon or oxygen, and 0 to 2 parts by volume (partial pressure 0–2 milli-torr) of water vapor. The samples are masked by placing an approximately 500×500 mil silicon chip having a thickness of about 15 mil on the top of each wafer sample in order to mask that area from the reactive ion etching plasma. The step created by the etching process is measured by a tally-step. The etching times are about 2 to 5 minutes and the average etch rates are determined by dividing the etch time into the taly-step measured steps created by the etching of the material surface in the areas not protected by the silicon chip. The results for the CCl$_4$, oxygen, H$_2$O mixtures are given in Table I and the results for the CCl$_4$, Ar, H$_2$O mixtures are given in Table II below.

TABLE I

Etch Rates Å/Min.
Gas Compositions CCl$_4$ + O$_2$ + H$_2$O in Milli-Torr

| Materials Etched | 2+8 | 2+8+1 | 2+8+2 | 5+5 | 5+5+1 | 5+5+2 |
|---|---|---|---|---|---|---|
| Si | 0 | 0 | 0 | 1350 | 600 | 760 |
| SiO$_2$ | 85 | 0 | 0 | 170 | 60 | 60 |
| Si$_3$N$_4$ | 110 | 0 | 0 | 210 | 100 | 120 |
| Cr | 240 | 240 | 200 | ≅240 | 240 | 180 |
| Al/Cu | 0 | 0 | 0 | 110 | 0 | 0 |

TABLE II

Etch Rates Å/min.
Gas Compositions CCl$_4$ + Ar + H$_2$O in Milli-Torr

| Materials Etched | 2+8 | 2+8+1 | 2+8+2 | 5+5 | 5+5+1 | 5+5+2 |
|---|---|---|---|---|---|---|
| Si | 800 | <20 | <20 | 580 | 900 | 980 |
| SiO$_2$ | 200 | <20 | <20 | 200 | 192 | 40 |
| Si$_3$N$_4$ | 367 | 20 | 32 | 240 | 240 | 40 |
| Cr | 200 | 180 | 200 | 160 | 180 | 120 |
| Al/Cu | 1800 | 0 | 0 | 1640 | 0 | 0 |

It can be seen from the etch rates recorded in Table I that the addition of 10 or 20% by volume water vapor to a 20/80 by volume mixture of CCl$_4$ and oxygen reduced the etch rate of silicon dioxide and silicon nitride to an immeasurably small amount without significantly affecting the etch rate of the chromium. The addition of 10 or 20% by volume of water vapor to the 50/50 by volume CCl$_4$ and O$_2$ mixture significantly decreased but did not prevent measurable etching of the silicon containing materials but did prevent the etching of aluminum-copper.

As illustrated in Table II, where argon was substituted for oxygen, the addition of the water vapor had the same general effect with the notable difference being that whereas silicon was etched at 800Å per minute in the absence of the water vapor by the 20/80 mixture of CCl$_4$ and argon, the addition of water vapor reduced the etch rate to below 20 Å per minute. With the 50/50 mixture, the etch rate of the silicon was not significantly effected, in fact, the data shows a slight increase. The above data illustrates the advantages of the addition of water vapor to the etch gas composition in reducing the attack of silicon materials and aluminum-copper alloys while etching chromium.

EXAMPLE II

Figure 1B:
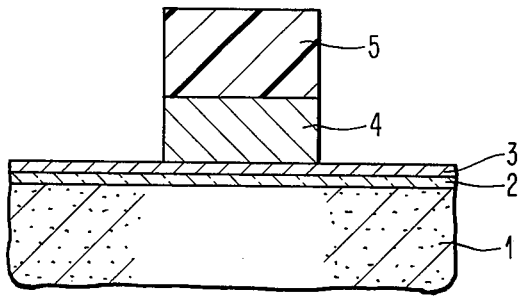
Figure 1C:
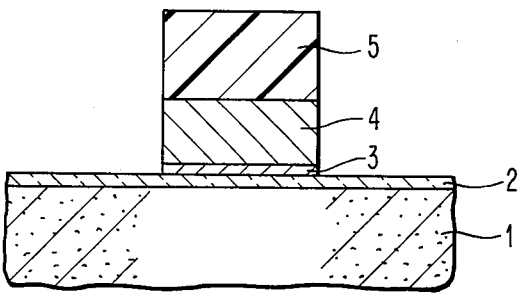

A composite structre of chromium/aluminum copper was etched according to the process of the invention. The starting structure is illustrated in FIG. 1A and includes a silicon wafer 1 having a layer 2 of silicon dioxide on its surface with a layer 3 of 0.1 micron thick chromium on the silicon dioxide, a layer 4 of 1 micron thick aluminum-copper alloy (96 percent by weight aluminum and 4 percent by weight copper) on the chromium layer and a patterned 1.5 micron thick photoresist layer 5 on the surface of the aluminium-copper layer. The resist layer is formed for the purpose of selectively exposing the composite structure to an etching plasma. The structure is placed on a plate at the cathode of a reactive ion etch tool and the aluminum-copper alloy is etched at a power level of 180 watts, or a power density of 0.3 watts/cm$^2$, using a gas mixture of 2 parts CCl$_4$ and 8 parts of argon by volume to provide a total pressure of 10 milli-torr. The cathode plate is silicon dioxide and the cathode is heated to from 150° C. to 250° C. The etch time is 10 minutes to remove the exposed aluminum-copper alloy layer down to the chromium (FIG. 1B). Two parts of water by volume are then added to the etching gas mixture to bring the total pressure to 12 milli-torr and the chromium is etched in 5 minutes down to the silicon dioxide surface without measurable attack on either the aluminum-copper alloy layer or the silicon dioxide layer 2 to provide the structure illustrated in FIG. 1C the photoresist is then stripped in situ by changing the etching gas mixture to 20 milli-torr of oxygen for 5 minutes. The process of the invention provides an improved method for the etching of chromium without significant attack on aluminum-copper, silicon and dielectric layers of silicon dioxide and silicon nitride during the formation of conductor metallurgy for microelectronic devices such as integrated circuits. While the invention has been particularly shown and described with reference to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A process for selectively etching chromium comprising exposing chromium to a glow discharge in a low pressure ambient atmosphere comprising a mixture of from about 5 to 50 percent by volume of a polychlorinated organic compound and from about 50 to 95 percent by volume of a material selected from the group consisting of a noble gas and oxygen to which mixture is added from 5 to 30 percent by volume, based on said mixture, of water vapor.

2. The process of claim 1 wherein the pressure is from about 5 to 50 milli-torr.

3. A process for selectively etching chromium from a workpiece comprising placing the workpiece on a first electrode in a chamber and subjecting the chromium to a glow discharge formed by electrically biasing the first electrode relative to a second electrode, in a low pressure ambient atmosphere comprising a mixture from about 5 to 50 percent by volume of a polychlorinated organic compound, from about 50 to 95 percent by volume of a material selected from the group consisting of a noble gas and oxygen and 5 to 30 percent by volume based on said mixture, of water vapor, said ambient atmosphere having a pressure in the range of about 5 to 50 milli-torr.

4. The process of claim 3 wherein the workpiece is a silicon semiconductor wafer including a layer of silicon dioxide on which is formed a layer of chromium which is partially covered by a masking layer.

5. The process of claim 3 wherein the polychlorinated organic compound is CCl$_4$.

6. The process of claim 3 wherein the pressure is from about 10 to 30 milli-torr.

7. The process of claim 6 wherein the material is oxygen.

8. The process of claim 6 wherein the material is a noble gas.

9. The process of claim 8 wherein the noble gas is argon.

10. A process for selectively etching chromium in the presence of a layer of material which is also exposed to the etching atmosphere comprising exposing the chromium to a glow discharge in an ambient atmosphere comprising from about 2 to 5 parts by volume of a polychlorinated organic compound, from about 5 to 8 parts by volume of a material selected from the group consisting of a noble gas and oxygen and from about 1 to 2 parts by volume of water vapor, the ambient atmosphere having a pressure of from about 5 to 50 milli-torr.

11. The process of claim 10 wherein the material is oxygen.

12. The process of claim 10 wherein the layer of mateiral comprises silicon dioxide.

13. The process of claim 10 wherein the layer of material comprises aluminum/copper.

14. The process of claim 10 wherein the layer of material comprises silicon nitride.

15. The process of claim 10 wherein the material is a noble gas.

16. The process of claim 15 wherein the noble gas is argon.

* * * * *